United States Patent [19]

Suzuki

[11] 4,097,125
[45] Jun. 27, 1978

[54] IMAGE FORMING OPTICAL SYSTEM

[75] Inventor: Akiyoshi Suzuki, Tokyo, Japan

[73] Assignee: Canon Kabushiki Kaisha, Tokyo, Japan

[21] Appl. No.: 701,946

[22] Filed: Jul. 1, 1976

[30] Foreign Application Priority Data

Jul. 2, 1975 Japan .................................. 50-82115

[51] Int. Cl.$^2$ ............................................. G02B 5/10
[52] U.S. Cl. ................................................ 350/294
[58] Field of Search ........................ 350/294, 199, 55; 355/51, 57, 60, 66

[56] References Cited

U.S. PATENT DOCUMENTS

| | | | |
|---|---|---|---|
| 2,684,015 | 7/1954 | Grey | 350/294 |
| 3,748,015 | 7/1973 | Offner | 350/294 |

*Primary Examiner*—Conrad J. Clark
*Attorney, Agent, or Firm*—Toren, McGeady and Stanger

[57] ABSTRACT

An optical system for forming an image of an object with extremely small aberrations at unit magnification including a concave mirror and a convex mirror having a smaller radius of curvature than that of the concave mirror and arranged in face-to-face relation to the concave mirror. To minimize the difference between the absolute values of inclination angle of the sagittal image surface and meridional image surface with respect to a common plane parallel to the optical axis at points of intersection therebetween, that is, at points where the astigmatic difference is zero, the center of the convex mirror is spaced from that of the concave mirror toward the concave mirror, whereby a light ray from an object located at a height dependent upon the axial separation between the concave and convex mirrors is reflected from the concave mirror to the convex mirror, then therefrom reflected to the concave mirror and then therefrom reflected again to form an image having a high resolution over a wide range of image width.

6 Claims, 5 Drawing Figures

IMAGE FORMING OPTICAL SYSTEM

BACKGROUND OF THE INVENTION

This invention relates to an optical system capable of forming an image with extremely small aberrations, and more particularly to an image forming optical system in which concave and convex mirrors are positioned to face each other.

The production of integrated circuits, for example, necessitates successive steps of photomechanically reproducing a multiplicity of circuit patterns on a single semiconductive wafer. As a method of fabricating integrated circuits in this manner, it is known to utilize a reflection image forming optical system for projecting the individual circuit patterns onto the wafer. Since such optical system is required to operate with high accuracy of imaging performance, an improvement has been made in U.S. Pat. No. 3,748,015 to A. Offner. For facilitating the understanding of the present invention, consideration will be at first given to Offner's system by reference to FIGS. 1 to 3.

In FIG. 1, there is schematically shown Offner's system having a concave spherical mirror $M_1$ and a convex spherical mirror M2 arranged to face each other with the center of curvature of the concave spherical mirror $M_1$ (i.e., the center of curvature of the concave spherical reflection surface) coinciding with the center of curvature of the convex spherical mirror M2 (i.e., the center of curvature of the convex spherical reflection surface) at a single point 0. The radius of curvature of mirror $M_1$, or the radius of curvature of the reflection surface of mirror $M_1$ is larger than that of mirror M2, or that of the reflection surface of mirror M2. Rays of light from an object point $P_1$ are at first reflected from mirror $M_1$ to mirror M2, then therefrom reflected to mirror $M_1$ and then therefrom reflected again finally to converge at an image point P2. If the object point $P_1$ is in a plane AA' containing the point 0 and perpendicular to the optical axis of the system, the image point P2 falls on this plane AA' to result in unit magnification of image. The heights of points $P_1$ and P2 from the optical axis OS OA are equal to each other, designated by a character $h$.

The aberrational aspect of the optical system shown in FIG. 1 is characterized by: (1) There is no possibility of producing spherical aberration. This is because the mirrors $M_1$ and M2 are disposed with their centers of curvature coinciding with each other at a single point 0, so that, as shown in FIG. 2, any ray of light emerging from the point 0 when reflected from any one of the mirrors $M_1$ and M2 returns back in exactly the same path as but in the opposite direction to that in which the ray emerges, independent of the angle of emergence with respect to the optical axis OA. In the actual case of the mirror arrangement of FIG. 2, however, it is impossible for rays from point 0 to enter the space between the mirrors $M_1$ and M2 as they are blocked by mirror M2, but the discussion concerning to the spherical aberration may be made with such rays as shown in FIG. 2. (2) There is no possibility of producing coma and distortion. This is because the optical paths of the system are symmetrical with respect to mirror M2 which also serves as a diaphragm of the system. (3) An image point P2 at a height, $h$, has no astigmatism, provided the convex mirror M2 is arranged so that its reflection surface contains a point Q2 at which the one of rays of light from the object point $P_1$ located at a height, $h$, which is parallel to the optical axis, namely, ray LR intersects the optical axis OA after reflection from the mirror $M_1$ at a point $Q_1$. After further reflection from mirror M2 at the point Q2, the principal ray LR is incident upon the mirror $M_1$ at Q3 and therefrom reflected to the image point P2 at the height, $h$. As is understandable from a geometrical consideration of the system, the optical paths $P_1Q_1$ and P2Q3 are parallel to each other. Other rays of light emerging from the object point $P_1$, for example, rays LR' and LR", at small acute angles of emergence with respect to the principal ray LR are finally reflected from mirror $M_1$ in respective paths parallel to those which they impinge upon the mirror $M_1$. Thus, all the rays are directed to a common point P2. Such a situation can be alternatively defined as follows: an image forming optical system comprising mirrors $M_1$ and M2 arranged to face each other with their centers of curvature being coincident with each other at a single point 0 is capable of projecting an object point at a height, $h$, into an image point at a height, $h$, with the result that the meridional image surface of the object point has almost no aberrations, when the radii of curvature, R. and, $r$, of the concave and convex mirrors $M_1$ and $M_2$ respectively satisfy the following relationship:

$$r = \frac{R^2}{2\sqrt{R^2 - h^2}}$$

Offner writes an approximation of the above formula using Taylor expansion. On the other hand, the sagittal image surface is completely free from aberrations at any image height, because FIG. 1 system is rotationally symmetrical with respect to a line $P_1OP_2$. In other words, all the rays including rays LR, LR' and LR" emerging from the object point $P_1$ are always converged into a common point $P_2$, as can be seen when the paper is turned about line $P_1OP_2$ as an axis of symmetry.

FIG. 3 shows the astigmatism condition of the system. At an image point of height, $h$, the meridional image curve intersects the sagittal image curve. At this intersection point, the astigmatism is zero. It will be understood from FIG. 3, however, that aberrationally good quality of image can be secured only in the vicinity of the image height $h$. In applying this image forming optical system of FIG. 1 to the recording of images with high resolution, as in printing integrated circuit patterns on a semiconductive wafer, therefore, the provision for exposing a limited region of the plane AA' near the height, $h$, to the system must be made. For example, a slit may be arranged either directly on the object being photographed and/or a recording medium, or may be projected as an image. This slit itself or slit image is of arcuate configuration about the optical axis OA and has an opening width limited to ensure that only the portion of the area of an image which is acceptable in image quality can be recorded on the recording medium. For the purpose of recording the entire area of the image with the acceptable image quality, the only need is to synchronously move the object and recording medium in the opposite directions to each other as indicated by arrows $D_1$ and $D_2$ along the common line AA'.

In defining the width of a slit of the type described, it has been the common practice to take into account the permissible defocus range of the system, in other words, the defocus range permissible to form an image with desired resolution, and the angle of inclination of the meridional image surface with respect to a plane perpendicular to the optical axis, namely, with respect to the sagittal image surface of FIG. 3 at an image height, $h$. In the case of Offner's system of FIG. 1, the slit width is determined from FIG. 3 as equal to the vertical distance between two horizontal lines passing respective points at which the meridional image curve intersects respective vertical lines representing the upper and lower limits of the permissible defocus range which are usually equal to $+2\lambda F^2_{eff}$ and $-2\lambda F^2_{eff}$ respectively, wherein $\lambda$ is the wavelength of the effective light, and $F_{eff}$ is the effective $f$-number of the system. Letting $\alpha$ denote the angle of inclination of the meridional image surface with respect to the sagittal image surface in FIG. 3, the slit width may be alternatively determined as equal to the product of $\cot\alpha$ and the permissible defocus range. On the other hand, the magnitude of the angle $\alpha$ is a function of the ratio $h/R$ that is, the ratio of the image height, $h$, at which the meridional image surface and the sagittal image surface intersect each other, or at which the astigmatic difference is zero (hereinafter referred to as "optimum image height") to the radius of curvature of the concave mirror $M_1$. The smaller the ratio $h/R$, the smaller the angle $\alpha$, and vice versa. For a given permissible defocus range, the smaller the ratio $h/R$, the larger the slit width, and vice versa. In order to increase the resolving power of the system, the $f$-number must be decreased with an increase in the diameter of the convex mirror M2. As the size of the mirror M2 is increased, the optimum image height must be increased, or the image-forming light bundle would be blocked by the mirror M2. As far as the system of FIG. 1 is concerned, increasing optimum image heights lead to increasing ratios of $h/R$, with a corresponding limitation of the slit width to rapidly very small values. This gives rise to various problems in utilizing the prior art system of FIG. 1, for example, to the process for fabricating IC devices. For example, when the slit is narrower, the time necessary to make an exposure is longer, and it is furthermore made more difficult to position the slit in accurate registry with the recording medium and/or the object being photographed.

SUMMARY OF THE INVENTION

An object of the present invention is to provide an image forming optical system comprising a concave mirror and a convex mirror arranged to face each other and capable of forming an image with extremely small aberrations in cooperation with a slit of which the width is wider than was previously possible.

Another object of the present invention is to provide an image forming optical system comprising a concave mirror and a convex mirror arranged to face each other and capable of forming an image of an object with high resolution in cooperation with a slit of which the width is wider than was previously possible.

Still another object of the present invention is to provide an image forming optical system comprising a concave mirror and a convex mirror arranged to face each other and adapted for use as a projection system of an image recording apparatus which may operate with an increased slit width while nevertheless permitting the recording of only the portion of the area of an image of an object which has extremely small aberrations.

To achieve these objects, the center of curvature of the convex mirror is shifted toward the concave mirror to minimize the difference between the absolute values of the angles of inclination of the meridional image surface and the sagittal image surface with respect to a common plane perpendicular to the optical axis of the system at the intersection of both surfaces. With this mirror arrangement, it is proven that the sagittal image surface is deviated perpendicular to the optical axis from the plane in which it is otherwise contained, while the degree of inclination of the meridional image surface toward the same plane is lowered to thereby enlarge the region of the area of an image which has acceptable image quality dependent upon the both image surface and the permissible defocus range.

DESCRIPTION OF THE PREFERRED EMBODIMENT

Figure 4:
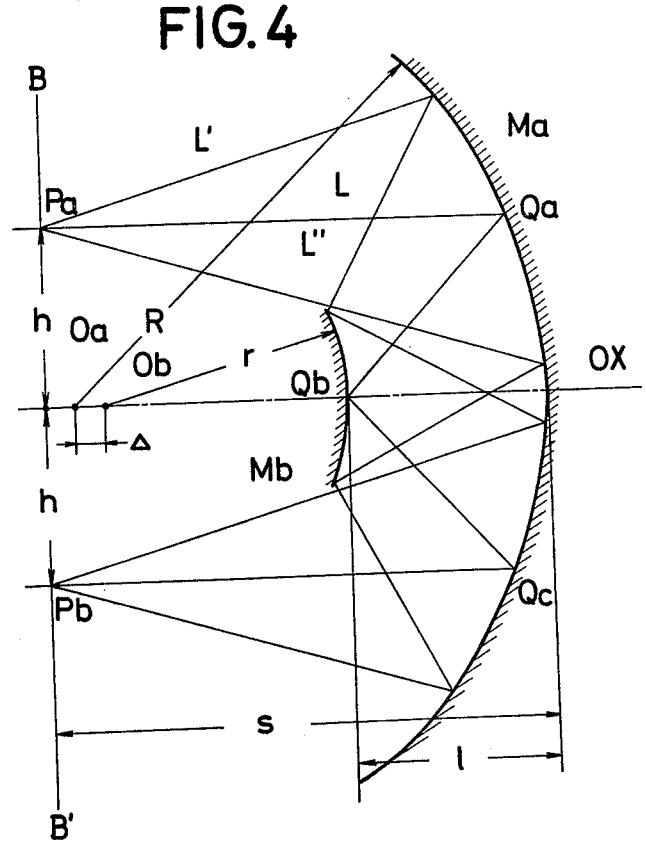
FIG. 4 is a diagram of geometry considered to explain the principle of the image forming optical system according to the present invention.

Referring now to FIG. 4, there is shown an embodiment of the image forming optical system according to the present invention as comprising a concave mirror Ma having a radius of curvature, R, and a convex mirror Mb having a radius of curvature, $r$, smaller than that of the concave mirror Ma, the mirrors Ma and Mb being arranged in face-to-face relation to each other with their centers of curvature, Oa and Ob, respectively lying on a common optical axis of the system but being separated from each other by a distance $\Delta$ as the center of curvature Ob of the convex mirror Mb is shifted from that of the concave mirror Ma toward the mirror surface of the latter. The relative aperture of the concave mirror Ma is larger than that of the convex mirror Mb.

Figure 1:
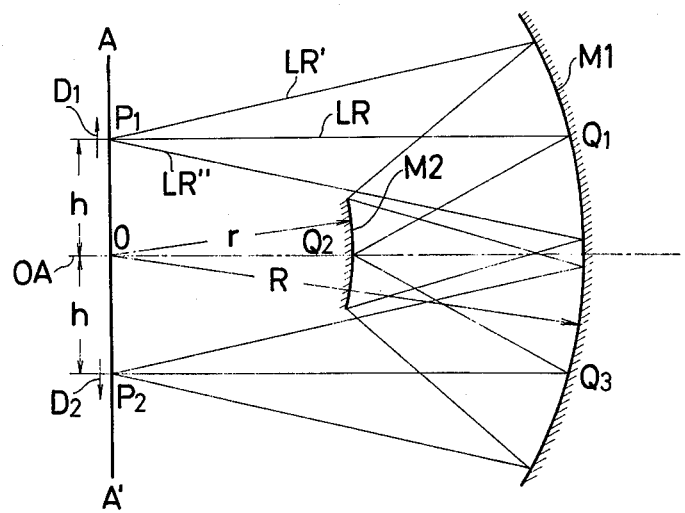
FIG. 1 is a diagram of geometry considered to explain the principle of a conventional image forming optical system comprising concave and convex mirrors arranged to face each other.
Figure 2:
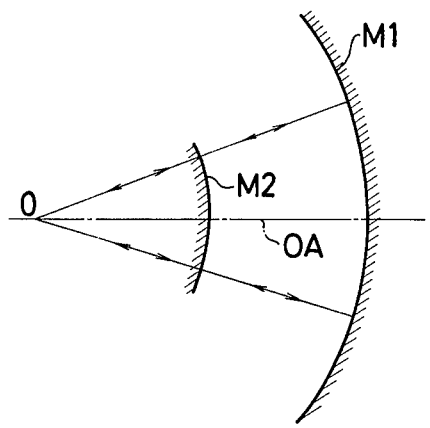
FIG. 2 is a similar diagram considered to prove that FIG. 1 system has no probability of producing spherical aberration.

Rays of light from an object point Pa including a central ray L and marginal rays L' and L" are at first reflected from concave mirror Ma to the convex mirror Mb which serves as a diaphragm of the system, then therefrom reflected to the concave mirror Ma and then therefrom reflected again, reaching a common point Pb at which an image of the object is formed with extremely small aberrations. These optical paths are symmetric with respect to the convex mirror Mb so that no coma and distortion are produced. But spherical aberration is produced to some extent because the centers of curvatures Oa and Ob of the both mirrors Ma and Mb do not coincide with each other at a single point. It has now been found, however, that the magnitude of spherical aberration produced is as small as practically negligible. Unlike the conventional system of FIG. 1, the system of FIG. 4 according to the invention has a sagittal image surface curved out of the plane which otherwise contains it in perpendicular to the optical axis OX by the deviation of the centers of curvature Oa and Ob from the coincidence at a single point. The present invention utilizes this curvature of the sagittal image surface to elongate the usable slit width.

In forming an image at almost unit magnification, the rays L, L' and L" from an object point Pa at a height, h, (or at a distance from the optical axis OX) are focused at a point Pb at a height equal to or at least very near the height, h, on the opposite side of the optical axis OX to that containing the object point Pa. In FIG. 4, the object point Pa and image point Pb are shown as lying on a common plane BB' perpendicular to the axis OX, but do not always lie on the common plane BB' even when the magnification of the image is unity. In any case, the following discussion is valid provided that the points Pa and Pb are conjugate to each other for the formation of an image at unit magnification.

In the system of the invention, the concave mirror Ma and convex mirror Mb are spaced apart from each other by an axial distance $l$ as expressed by the following formula (1)

$$l = R - \frac{R^2}{2\sqrt{R^2 - h^2}} \quad (1)$$

as the convex mirror Mb is arranged to contain substantially at its reflection surface a point Qb at which the central ray L from the object point Pa of height h proceeding parallel to the axis OX after being reflected from the concave mirror Ma intersects the optical axis OX at a pont Qa. After further reflection from the convex mirror Mb at the point Qb, the central ray L is incident upon the concave mirror Ma at a point Qc and is then reflected therefrom to the image point Pb, whereby the optical paths PaQa and QcPb are made parallel to each other. Also for the other rays including the marginal rays L' and L" emerging from the object point Pa at respective acute angles of inclination with respect to the central ray L, it is proven that the path of the ray incident upon mirror Ma is parallel to the path along which the ray, after being reflected from the mirror Mb emerges therefrom. As is understandable from a simple geometrical consideration, these rays L' and L" are finally to arrive in the vicinity of point Pa provided that the angles of inclination of these rays L' and L" are small. As a result, the object point Pa is projected to the image point Pb relative to the meridional plane (or the plane of the drawing).

The axial separation of the concave and convex mirrors Ma and Mb as defined by the formula (1) leads to the intersection of the meridional image surface and the sagittal image surface at a height almost equal to the height h of the object point Pa. Therefore, the image point at the height h has no substantial astigmatism. With the optical system of the invention, it is possible to project an object point Pa at a height h into an image point Pb at a height substantially equal to the height h of the object point Pa without coma, distortion and astigmatic difference and further with negligible spherical aberration.

Figure 3:
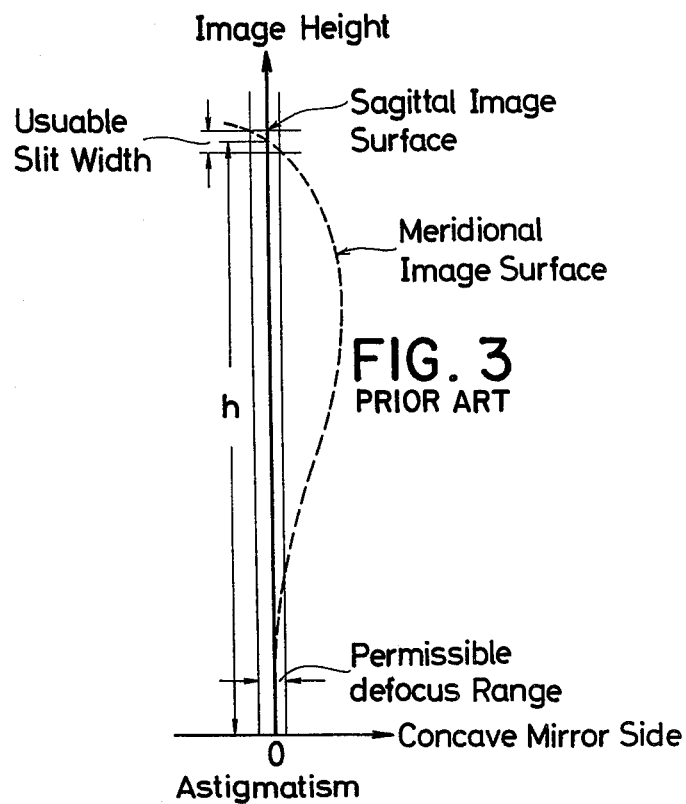
FIG. 3 is a graph showing the possible astigmatism of FIG. 1 system and explaining the definition of the usuable slit width.
Figure 5:
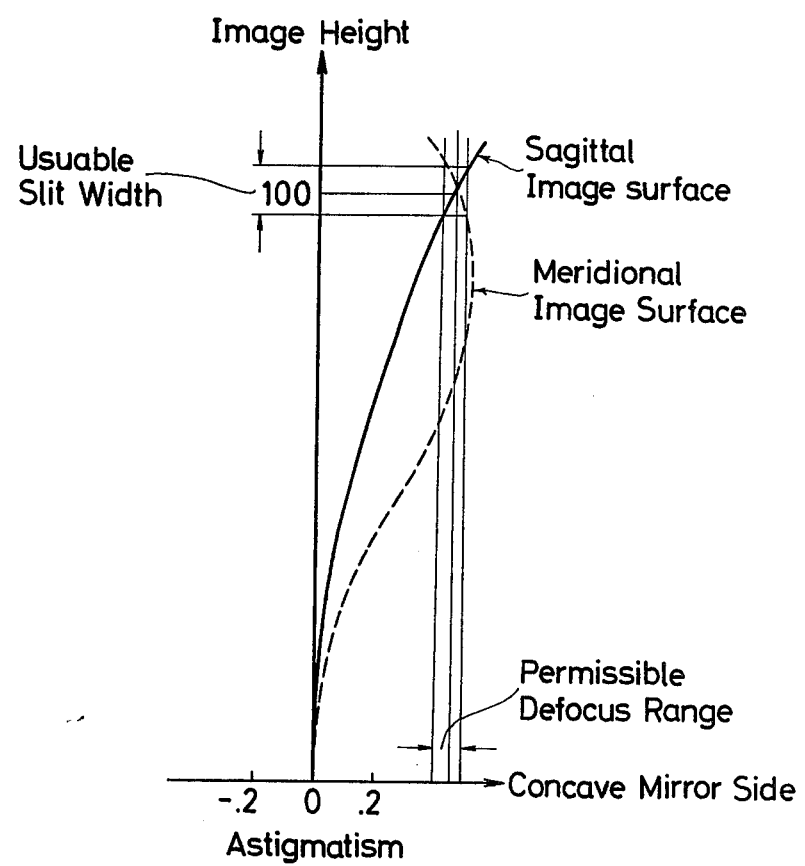
FIG. 5 is a graph showing astigmatism occuring in one specific example of the system of FIG. 4 and the background for elongation of the usuable slit width.

FIG. 5 shows the astigmatic aspect of one specific example of the optical system of the invention constructed in accordance with the data shown in Table 1, below, wherein the meridional image surface and the sagittal image surface are largely declined toward the concave mirror Ma compared with those of FIG. 3 as the center of curvature Ob of the convex mirror Mb is shifted from that of the concave mirror Ma toward the latter by the axial distance Δ. At the intersection of the both surfaces, the astigmatic difference is zero so that an image point of optimum quality is formed at the height. The intersection angle of the both surfaces, designated α, is nearly equal to that occurring in FIG. 3 at the equivalent height, independent of the degree of declination of these surfaces. As the axial distance between the centers of curvature Oa and Ob of mirrors Ma and Mb is increased, the degree of declination of the both surfaces are increased with the result that those portions of the meridional and sagittal image surfaces which are within the lines representing a permissible defocus range and near the intersection point therebetween is turned in the clockwise direction about the intersection point as viewed in FIG. 5 while being translated toward the right.

As has been mentioned above, the maximum possible slit width, in other words, the upper limit of an acceptable range of the width of a slit cooperative with the optical system of the invention to form an image with extremely small aberrations is dependent upon the angles of inclination of the meridional and sagittal image planes with respect to the optical axis and the permissible defocus range, which is usually defined by $\pm 2\lambda F^2_{\text{eff}}$ around a point at which the astigmatism is zero. As is evident from FIG. 5, the smaller the difference between the absolute values of the angles of inclination of the meridional image surface and the sagittal image surface with respect to the optical axis, the larger the usuable slit width. In order to insure that use can be made of a slit having a wider width than that of the slit usuable with the conventional system of FIG. 1 to form an image of equivalent quality at a desired height of the optimum image quality, it is required that the optical system of the invention satisfies the following relationships:

$$R - \frac{R^2}{2\sqrt{R^2 - h^2}} < r < \frac{R^2}{2\sqrt{R^2 - h^2}} \quad (2)$$

$$\frac{1}{10}\left(\frac{R^2}{2\sqrt{R^2 - h^2}} - R\right) \leq \Delta < \frac{R^2}{\sqrt{R^2 - h^2}} - R \quad (3)$$

When the upper limit of formula (2) and the lower limit of formula (3) are violated, the absolute value of the angle of inclination of the meridional image surface with respect to a plane perpendicular to the optical axis becomes too much large as compared with the sagittal image surface. On the other hand, when the lower limit of formula (2) and the upper limit of the formula (3) are violated, the absolute value of the angle of inclination of the sagittal image surface to a plane perpendicular to the optical axis becomes too much large as compared with the meridional image surface. In either case, it is impossible to fully expand the range of forming an image of good quality.

In applying of the system of the invention to an apparatus for projecting images of objects onto recording media by use of a slit (or slit image) having a width suitable therefor, various experiments conducted by the present inventors indicate that it is preferable for, r, and Δ, to satisfy the following conditions:

$$\frac{9}{10}R - \frac{2}{5}\frac{R^2}{\sqrt{R^2 - h^2}} \leq r \leq \frac{1}{10}R + \frac{2}{5}\frac{R^2}{\sqrt{R^2 - h^2}} \quad (4)$$

-continued $$\frac{1}{10} \left( \frac{R^2}{\sqrt{R^2 - h^2}} - R \right) \leq \Delta \leq \frac{9}{10} \left( \frac{R^2}{\sqrt{R^2 - h^2}} - R \right) \quad (5)$$

It has further been found that when r satisfies the following condition, the width of the range of forming an image of good quality becomes maximum.

$$r = (1/2)R \quad (6)$$

Under condition (6), the absolute values of the angles of inclination of the meridional image surface and the sagittal image surface with respect to the optical axis are made almost equal to each other. In this case, the usuable slit width is almost equal to the product of $\cot(\alpha/2)$ and the permissible defocus range, wherein $\alpha$ is the intersection angle of the both surfaces as mentioned above. This indicates that the system of the invention makes it possible to use a slit having a width 2 times as large as that of the slit usuable with the FIG. 1 system to form equivalent image.

Three examples of the embodiment of the system of the invention may be constructed in accordance with the data shown in Table 1, wherein $h_o$ is the height of an object point Pa to be projected, and S is the axial distance between a common plane containing the image point and object point and the concave mirror Ma.

Table 1

| Example No. | R | r | l | h | $h_o$ | S |
|---|---|---|---|---|---|---|
| 1 | 600 | 300 | 295.745 | 100.16 | 100 | 604.075 |
| 2 | 600 | 300 | 293.814 | 120.27 | 120 | 605.806 |
| 3 | 600 | 300 | 290.161 | 150.53 | 150 | 608.880 |

In each example, the radii of curvature, R and r, of the concave and convex mirrors Ma and Mb are determined as 600 mm and 300 mm respectively. For given object points Pa of heights of 100, 120 and 150 mm, the respective axial separations between the concave and convex mirrors Ma and Mb are determined by formula (1), and next the respective optimum image heights, h's, are determined by ray tracing for zero astigmatic difference. The fact that the optimum image heights h's are slightly different from the heights $h_o$'s of the corresponding object points, is due to the employment of rays emerging from the object point at relatively large acute angle with respect to the optical axis in deriving the optimum image heights by ray tracing. Therefore, this difference does not essentially deny the above explanation, but shows the degree of reliability of formula (1) on the determination of the values of the parameters. Nevertheless, it is necessary to take into account this difference in designing the optical system of the invention.

It will be seen from the foregoing description that the present invention provides an image forming optical system which may operate with a slit having a width 2 times as large as that of a slit with the conventional optical system having concentrically arranged spherical mirrors when applied to an apparatus for fabricating IC devices by the photomechanical printing technique. Accordingly, the exposure time may be halved to effect equivalent results. Further, the elongation of the slit width will result in reduction of the accuracy of the mechanical position control of the slit relative to the optical system as well as to the object being photographed and the recording media. Furthermore, according to the principle of the invention, it is made possible to employ a smaller f-number and a higher optimum image height than those of the system of FIG. 1 to effect results equivalent to those of the system of FIG. 1, as the width of the slit may be increased to 2 times that possible in the prior art. This leads to an increase in the resolving power of the optical system. The present invention has been described in connection with the rays of light, but the effectiveness of the invention is not diminished when the rays of light are replaced by supersonic waves.

What is claimed is:
1. An image forming optical system comprising;
   (a) a concave mirror;
   (b) a convex mirror having a smaller radius of curvature than that of said concave mirror and arranged in face-to-face relation with said concave mirror at a location such that the center of curvature of said convex mirror is spaced from that of said concave mirror toward said concave mirror, and
   (c) said concave mirror comprising means for reflecting radiation incident on said optical system to said convex mirror and for reflecting said radiation from said convex mirror out of said optical system in a direction generally opposite that of said radiation incident on said optical system.
2. An image forming optical system according to claim 1, satisfying the following conditions:

$$R - \frac{R^2}{2\sqrt{R^2 - h^2}} < r < \frac{R^2}{2\sqrt{R^2 - h^2}}$$

$$\frac{1}{10} \left( \frac{R^2}{\sqrt{R^2 - h^2}} - R \right) \leq \Delta < \frac{R^2}{\sqrt{R^2 - h^2}} - R$$

where R is the radius of curvature of said concave mirror; r is the radius of curvature of said convex mirror; h is the desired height of an image point of optimum quality from the line passing through the centers of curvature of said convex and said concave mirrors; and $\Delta$ is the distance between the centers of curvature of said concave and said convex mirrors.
3. An image forming optical system comprising;
   (a) a concave mirror;
   (b) a convex mirror having a smaller radius of curvature than that of said concave mirror and arranged in face-to-face relation with said concave mirror at a location such that the reflection surface of said convex mirror substantially includes a point at which a light ray parallel to the optical axis of the system after being reflected from said concave mirror at a height equal to the desired height of an image point of optimum quality intersects the optical axis, the center of curvature of said convex mirror being spaced from that of said concave mirror toward said concave mirror, and
   (c) said concave mirror comprising means for reflecting radiation incident on said optical system to said convex mirror and for reflecting said radiation from said convex mirror out of said optical system in a direction generally opposite that of said radiation incident on said optical system.
4. An image forming optical system according to claim 3, satisfying the following conditions:

$$R - \frac{R^2}{2\sqrt{R^2 - h^2}} < r < \frac{R^2}{2\sqrt{R^2 - h^2}}$$

$$\frac{1}{10}\left(\frac{R^2}{\sqrt{R^2-h^2}}-R\right) \leqq \Delta < \frac{R^2}{\sqrt{R^2-h^2}}-R$$

where R is the radius of curvature of said concave mirror; r is the radius of curvature of said convex mirror; h is the desired height of an image point of optimum quality, and Δ is the distance between the centers of curvature of said concave and said convex mirrors.

5. An image forming optical system according to claim 3, wherein said convex mirror has a radius of curvature substantially equal to ½ times that of said concave mirror.

6. An image forming optical system comprising:
 (a) a concave mirror;
 (b) a convex mirror having a smaller radius of curvature than that of said concave mirror and arranged in face-to-face relation with said concave mirror at a location such that the center of curvature of said convex mirror is spaced from that of said concave mirror toward said concave mirror; and
 (c) said concave mirror and said convex mirror comprising means for reflecting radiation incident on said optical system from an object positioned at a position deviating from the optical axis of the optical system from said concave mirror to said convex mirror, and reflected from said concave mirror to a location outside said optical system to form an image at an image point at the opposite side of said object point in respect to the optical axis of said optical system, the optical path for the radiation from said object point to the image point being summetrical with respect to said convex mirror.

* * * * *